(12) United States Patent
Arndt et al.

(10) Patent No.: US 9,496,371 B1
(45) Date of Patent: Nov. 15, 2016

(54) CHANNEL PROTECTION DURING FIN FABRICATION

(71) Applicant: International Business Machines Corporation, Armonk, NY (US)

(72) Inventors: Russell H. Arndt, Fishkill, NY (US); Hong He, Schenectady, NY (US); Gauri Karve, Cohoes, NY (US); Fee Li Lie, Albany, NY (US); Muthumanickam Sankarapandian, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/877,051

(22) Filed: Oct. 7, 2015

(51) Int. Cl.
*H01L 21/336* (2006.01)
*H01L 29/66* (2006.01)
*H01L 29/10* (2006.01)
*H01L 21/31* (2006.01)
*H01L 21/306* (2006.01)
*H01L 21/311* (2006.01)
*H01L 21/32* (2006.01)
*H01L 21/3105* (2006.01)
*H01L 21/02* (2006.01)

(52) U.S. Cl.
CPC ... *H01L 29/66795* (2013.01); *H01L 21/02532* (2013.01); *H01L 21/30604* (2013.01); *H01L 21/31* (2013.01); *H01L 21/31056* (2013.01); *H01L 21/31133* (2013.01); *H01L 21/31138* (2013.01); *H01L 21/31144* (2013.01); *H01L 21/32* (2013.01); *H01L 29/1033* (2013.01)

(58) Field of Classification Search
CPC .................................................... H01L 21/336
See application file for complete search history.

(56) References Cited

U.S. PATENT DOCUMENTS

| | | | |
|---|---|---|---|
| 7,074,662 | B2 | 7/2006 | Lee et al. |
| 7,348,225 | B2 | 3/2008 | Zhu |
| 7,749,879 | B2 | 7/2010 | Ahn et al. |
| 8,441,043 | B2 | 5/2013 | Bangsaruntip et al. |
| 8,513,073 | B1 | 8/2013 | Basker et al. |
| 8,536,029 | B1 | 9/2013 | Chang et al. |
| 8,580,624 | B2 | 11/2013 | Bangsaruntip et al. |
| 8,637,359 | B2 | 1/2014 | Chang et al. |
| 8,722,472 | B2 | 5/2014 | Chang et al. |
| 8,809,957 | B2 | 8/2014 | Bangsaruntip et al. |
| 8,815,674 | B1 | 8/2014 | Reimer et al. |
| 2012/0213940 | A1 | 8/2012 | Mallick |
| 2013/0196488 | A1 | 8/2013 | Hekmatshoartabari et al. |
| 2015/0099340 | A1 | 4/2015 | Yu et al. |
| 2015/0102414 | A1 | 4/2015 | Yu et al. |

*Primary Examiner* — Marvin Payen
(74) *Attorney, Agent, or Firm* — Gibb & Riley, LLC; Steven J. Myers, Esq.

(57) ABSTRACT

A method for protecting channels during fin fabrication. Fins are formed on a substrate. A conformal liner layer (or layers) is applied on the fins. Active portions of a semiconductor device are patterned in the fins using a first organic planarizing material. The first organic planarizing material is stripped. The length of the fins is adjusted using a second organic planarizing material. The second organic planarizing material is stripped. The conformal liner layer(s) is stripped.

20 Claims, 4 Drawing Sheets

CHANNEL PROTECTION DURING FIN FABRICATION

BACKGROUND

The present disclosure relates to semiconductor device fabrication and more particularly to protection of the channel during fabrication of devices with fins.

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

SUMMARY

Systems and methods described herein circumvent erosion of fins formed from a semiconductor such as Si, SiGe, or III-V during manufacturing stages by multiple methods. In the method described, a single sacrificial liner layer or multi layers may be used to protect the fins during subsequent processing, particularly wet chemical processing with aggressive chemicals such as hot Sulfuric-Peroxide Mixture (SPM), or dry strip processes, or vapor phase film removal.

According to a method, fins are formed on a substrate. A single conformal liner layer or plurality of layers is applied on the fins. Active portions of a semiconductor device are formed using lithographic processes. The first organic planarizing material is stripped. The length of the fins is adjusted using a second organic planarizing material. The second organic planarizing material is stripped. The conformal liner layer(s) is stripped.

According to another method, a patterned hardmask layer is formed above a semiconductor substrate. An etching process is performed through the patterned hard mask layer. The etching process forms a plurality of trenches in the semiconductor substrate. The trenches define a fin. A conformal liner layer is formed on the fins. Active portions of a semiconductor device are patterned in the fins using a first organic planarizing material. The first organic planarizing material is selectively removed. The length of the fins is adjusted using a second organic planarizing material. The second organic planarizing material is selectively removed. The hardmask layer is removed. The conformal liner layer is stripped.

According to a computer program product for protecting channels during fin fabrication, the computer program product comprises a computer readable storage medium having program instructions embodied therewith. The program instructions are readable/executable by a processor to cause the processor to perform a method. According to the method, fins are formed on a substrate. A single conformal liner layer or a plurality of layers is applied on the fins. Active portions of a semiconductor device are patterned in the fins using a first organic planarizing material. The first organic planarizing material is clean. The length of the fins is adjusted using a second organic planarizing material. The second organic planarizing material is cleaned. The conformal liner layer(s) is stripped.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
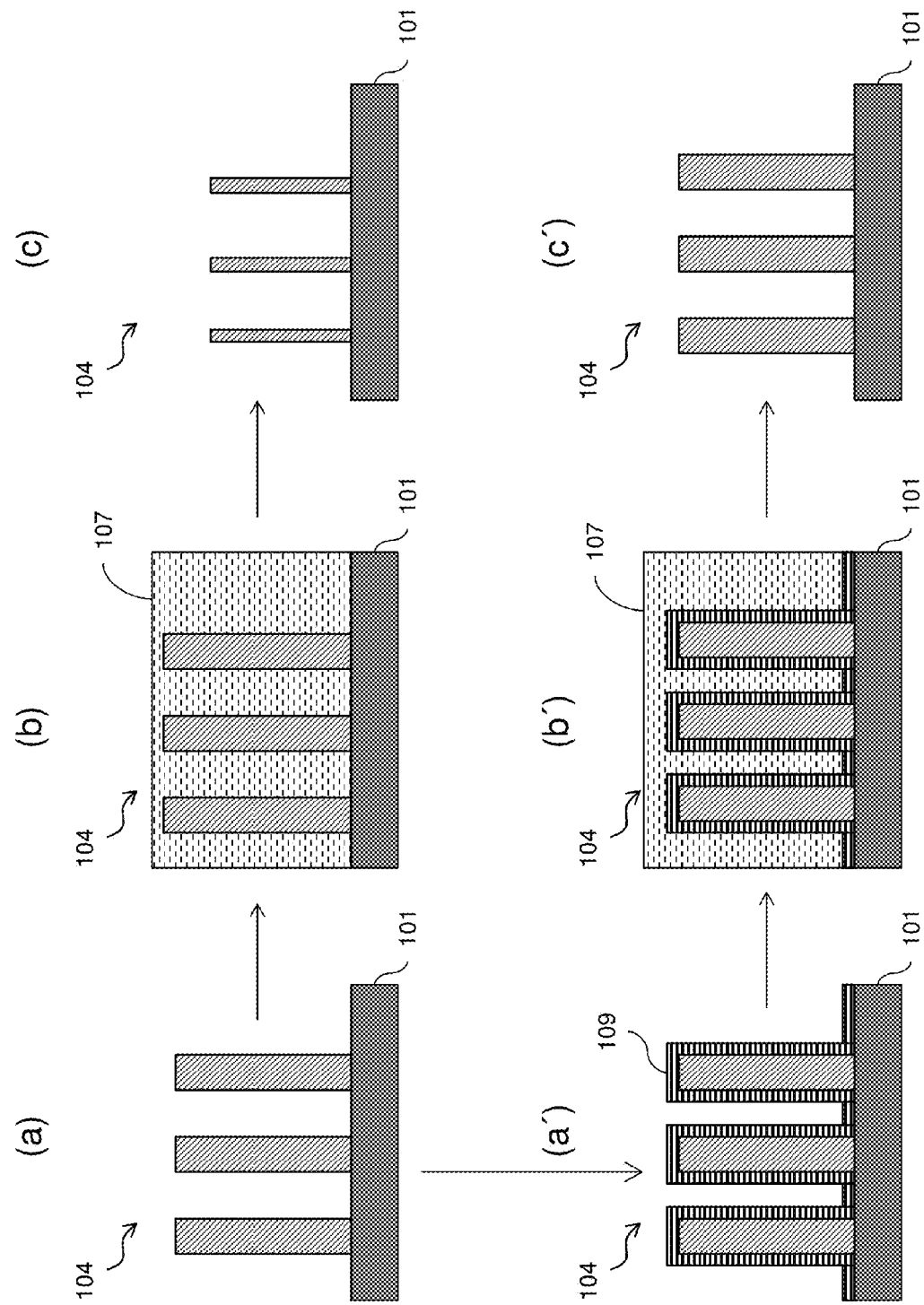
FIG. 1 is an illustration of the process flow according to devices and methods herein.

The disclosure will now be described with reference to a process for protection of SiGe and Si fins during wet stripping of organic planarizing layers in the manufacture of finned semiconductor structures in order to achieve target dimensions in areas of the fins. While the disclosure will be described hereinafter in connection with specific devices and methods thereof, it will be understood that limiting the disclosure to such specific systems and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. In the drawings, like reference numerals have been used throughout to identify identical elements.

Semiconductor device fabrication is typically a multiple step sequence of photolithographic and chemical processing steps during which electronic circuits are gradually created on a wafer made of semiconducting material. Etching is used to remove layers from the surface of a wafer during manufacturing. Etching, in conjunction with lithographic techniques, is used to attack certain areas of a semiconductor surface in order to form recesses in the material or to otherwise remove portions of semiconductor layers where predominantly vertical sides are desired. For many etching steps, part of the wafer is protected from the etchant by a masking material that resists etching.

Semiconductor fins are often used in advanced semiconductor manufacturing technology because of the increased device performance they provide. In manufacturing semiconductor structures having fins, SiGe fin erosion has been observed for Si and compositions using 25% silicon-germanium (SiGe). It is expected that higher concentrations of germanium in SiGe fins will have more serious erosion problems. Erosion occurs during stripping of the oxide protective layer by processes such as hot SPM, which are corrosive to high concentration SiGe, Ge, and III-V compound semiconductor material. Different amounts of fin loss for SiGe and Si structures have been observed during nitride hardmask removal. A Si fin also undergoes erosion highlighting native oxide formation and removal issues. Further, Si and SiGe fins erode to different extents during patterning causing large differences in the critical dimensions of N and P fins made of different materials.

For electronic applications, semiconducting substrates, such as silicon wafers, can be used. The substrate enables easy handling of the micro device through the many fabrication steps. Often many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many other steps performed. The complexity of microfabrication processes can be described by their mask count.

Referring to FIG. 1, the top row illustrates some typical processing steps used in forming fins on a silicon substrate 101. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. In section (a) of FIG. 1, fins 104 are formed in or on the silicon substrate 101. The fins 104 can be formed by patterning a hardmask (not shown) on the silicon substrate 101 and performing a material removal process, such as reactive ion etching (RIE) or other appropriate process known in the art. A hardmask can be formed of any suitable material, whether now known or developed in the future, such as a metal or organic hardmask, which has a greater resistance to the etching process than the substrate and materials used in the remainder of the structure. In other words, the patterning of the hardmask defines the location of the fins 104 on the silicon substrate 101.

In section (b) of FIG. 1, patterning is performed on the fins 104 to isolate the active parts of a semiconductor device, such as a transistor (FINFET), and the like. Patterning covers the series of processes that shape or alter the existing shape of the deposited materials and is generally referred to as lithography. For example, in conventional lithography, the wafer is coated with a chemical called a "photoresist". The photoresist is exposed by a "stepper", a machine that focuses, aligns, and moves the mask, exposing select portions of the wafer to short wavelength light. The unexposed regions are washed away by a developer solution. After etching or other processing, a cleaning process removes the remaining photoresist layer 107. Each of the lithography operations may be reworked, as necessary. After each photoresist layer 107 is no longer needed, it may be removed from the silicon substrate 101 by an appropriate wet or dry stripping process. This usually requires a liquid "resist stripper" that chemically alters the resist so that it no longer adheres to the substrate. For example, a 'wet' removal process may include hot SPM, a mixture of sulfuric acid ($H_2SO_4$) and hydrogen peroxide ($H_2O_2$) at a temperature above 90° C. Alternatively, the photoresist layer 107 may be removed by 'dry' strip, such as a plasma containing oxygen, which oxidizes it. Furthermore, different amount of SiGe and Si fin loss has been observed during hardmask removal.

Multiple etching and cleaning steps cause erosion in the dimensions of the fins 104. Some of the critical dimensions include, fin width, fin length, and comparable dimensions for Si or SiGe fins for N and P functions. As shown in section (c) of FIG. 1, the fins 104 may lose up to half of their structure, or more; and the effect may be different for different ones of the fins 104.

The bottom row of FIG. 1 illustrates some processing steps, according to structures and methods herein. Again, in section (a) of FIG. 1, fins 104 are formed in or on the silicon substrate 101. In section (a') of FIG. 1, a protective layer 109 is deposited on the fins 104, for example by atomic layer deposition (ALD), chemical vapor deposition (CVD), physical vapor deposition (PVD), evaporation, or plasma sputtering. These methods can be used to deposit several types of thin films, including various oxides (e.g., $Al_2O_3$, $TiO_2$, $SnO_2$, $ZnO$, $HfO_2$), metal nitrides (e.g., TiN, TaN, WN, NbN), metals (e.g., Ru, Ir, Pt), and metal sulfides (e.g., ZnS). In section (b') of FIG. 1, patterning is performed on the fins 104 to isolate the active parts of a semiconductor device. The protective layer 109 preserves the dimensions of the SiGe and Si fins during fin cuts and during hardmask removal. Furthermore, the protective layer 109 allows for reworkability during lithography, without impacting SiGe/III-V fin dimensions. The also allows achievement of comparable dimensions for Si and SiGe fins (and III-V).

As shown in section (c') of FIG. 1, the protective layer 109 enables control of the fin dimension with very little variability in dimensions of the fins 104 during fabrication.

For example, for a single conformal liner according to devices and methods herein, the first step is formation of the fin. This may be performed by etching, such as reactive ion etching (RIE), of a semiconductor wafer. Etching may be used in microfabrication to chemically remove layers from the surface of the wafer during manufacturing. RIE is a highly anisotropic etch process used to create deep, steep-sided holes and trenches in wafers. For the etch steps, part of the wafer may be protected from the etchant by a "masking" material that resists etching. In some cases, the masking material may be a photoresist that has been patterned using photolithography. Other situations require a more durable mask, such as silicon nitride. After the etching, the wafer may be cleaned. Next, the protective layer 109 is deposited for example by atomic layer deposition (ALD), chemical vapor deposition (CVD), physical vapor deposition (PVD), evaporation, or plasma sputtering in order to form a conformal layer. The protective layer 109 covers the fin sidewalls and fin tip. A first lithography may be performed to isolate the active parts of the semiconductor device being manufactured. The first lithography may require multiple processes and reworking of portions of the fins. Then an etching process, such as RIE may be used to remove inactive fins, followed by wet cleaning of the wafer. A second lithography may be used adjust the length of the fins, and/or cut out unwanted fins. The second patterning may be in a direction perpendicular to the fin in order to adjust the length of the fins. As above, the second lithography may require multiple processes and reworking of portions of the fins. Again, RIE may be used to cut the fins followed by wet cleaning of the wafer. A removal process may be performed to remove the masking material and, again, the wafer may be cleaned. Finally, the conformal liner of the protective layer 109 is removed.

For a dual conformal liner according to devices and methods herein, a similar process may be used. This process adds a second protective layer prior to the removal of the masking material. The first step is formation of the fin and wet cleaning of the wafer. Next a first protective layer 109 is deposited. The protective layer 109 covers the fin sidewalls and fin tip. A first lithography is performed to isolate the active parts of the semiconductor device being manufactured. The first lithography may require multiple processes and reworking of portions of the fins. As described above, RIE may be used to remove inactive fins followed by wet cleaning of the wafer. Again, a second lithography may be used adjust the length of the fins and/or cut out unwanted fins. The second patterning may be in a direction perpendicular to the fin in order to adjust the length of the fins. As above, the second lithography may require multiple processes and reworking of portions of the fins. RIE may be used to cut the fins followed by wet cleaning of the wafer. Then, a second protective layer may be deposited over the first protective layer 109. The second protective layer may be deposited for example by atomic layer deposition (ALD), chemical vapor deposition (CVD), physical vapor deposition (PVD), evaporation, or plasma sputtering in order to form a second conformal liner layer over the first protective layer 109. The second conformal liner layer covers the first protective layer 109 on the fin sidewalls and the fin tip in the orthogonal direction. In this manner, the second protective layer can correct imperfections in the first protective layer 109 resulting from the various etching and cleaning steps. Furthermore, the second conformal layer can preserve the tip of the SiGe fin during subsequent removal or the masking material. A removal process may be performed to remove the masking material and, again, the wafer may be cleaned. Finally, the conformal liner of the first protective layer and second protective layer is removed.

Figure 2:
FIG. 2 is a flow diagram according to devices and methods herein.

FIG. 2 is a flow diagram illustrating the processing flow of an exemplary method of protecting channels and fin structure during fin fabrication according to devices and methods herein. In item 210, a patterned hardmask layer is formed on a semiconductor substrate. An etching process is performed through the patterned hardmask layer, at 215. The etching process forms a plurality of trenches in the semiconductor substrate, defining fins. A conformal liner layer is formed on the fins, at 220. Active portions of a semiconductor device are patterned in the fins using a first organic planarizing material, at 225. At 230, the first organic planarizing material is selectively removed. At 235, the length of the fins is adjusted using a second organic planarizing material. The second organic planarizing material is selectively removed, at 240. At 245, another conformal liner layer is optionally formed on the fins. The hardmask layer is removed, at 250. The conformal liner layer(s) is stripped, at 255.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

While only one or a limited number of transistors are described or illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 3:
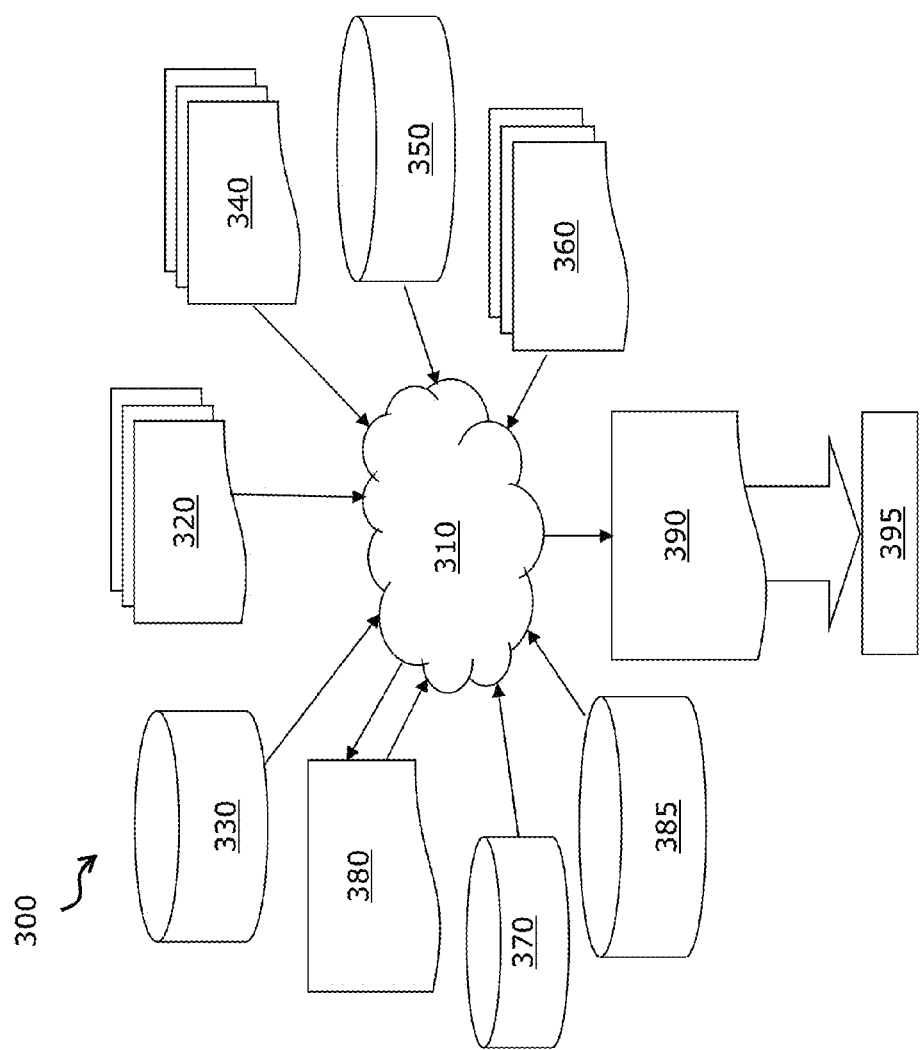
FIG. 3 is a block diagram illustrating an exemplary design flow used, for example, in the logic design, simulation, test, layout, and manufacture of the structures disclosed herein.

FIG. 3 shows a block diagram of an exemplary design flow 300 used for example, in semiconductor IC logic design, simulation, test, layout, and manufacture. Design flow 300 includes processes, machines, and/or mechanisms for processing design structures or devices to generate logically or otherwise functionally equivalent representations of the design structures and/or devices described above and shown in FIGS. 1 and 2. The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer. When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, or system such as those shown in FIGS. 1 and 2. As such, design structure 320 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 310 preferably employs and incorporates hardware and/or software modules for synthesizing, translating, or otherwise processing a design/simulation functional equivalent of the components, circuits, devices, or logic structures shown in FIGS. 1 and 2 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which Netlist 380 is resynthesized one or more times depending on design specifications and parameters for the device. As with other design structure types described herein, Netlist 380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310 without deviating from the scope and spirit of the invention. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 390 may comprise a compiled, executable HDL simulation model that functionally simulates the devices shown in FIGS. 1 and 2.

Design structure 390 may also employ a data format used for the exchange of layout data of integrated circuits and/or symbolic data format (e.g., information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 2. Design structure 390 may then proceed to a stage 395 where, for example, design structure 390: proceeds to tape-out, is released to manufacturing, is released to a mask house, is sent to another design house, is sent back to the customer, etc.

Aspects of the present disclosure are described herein with reference to flowchart illustrations and/or block diagrams of methods, apparatus (systems), and computer program products according to devices and methods herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
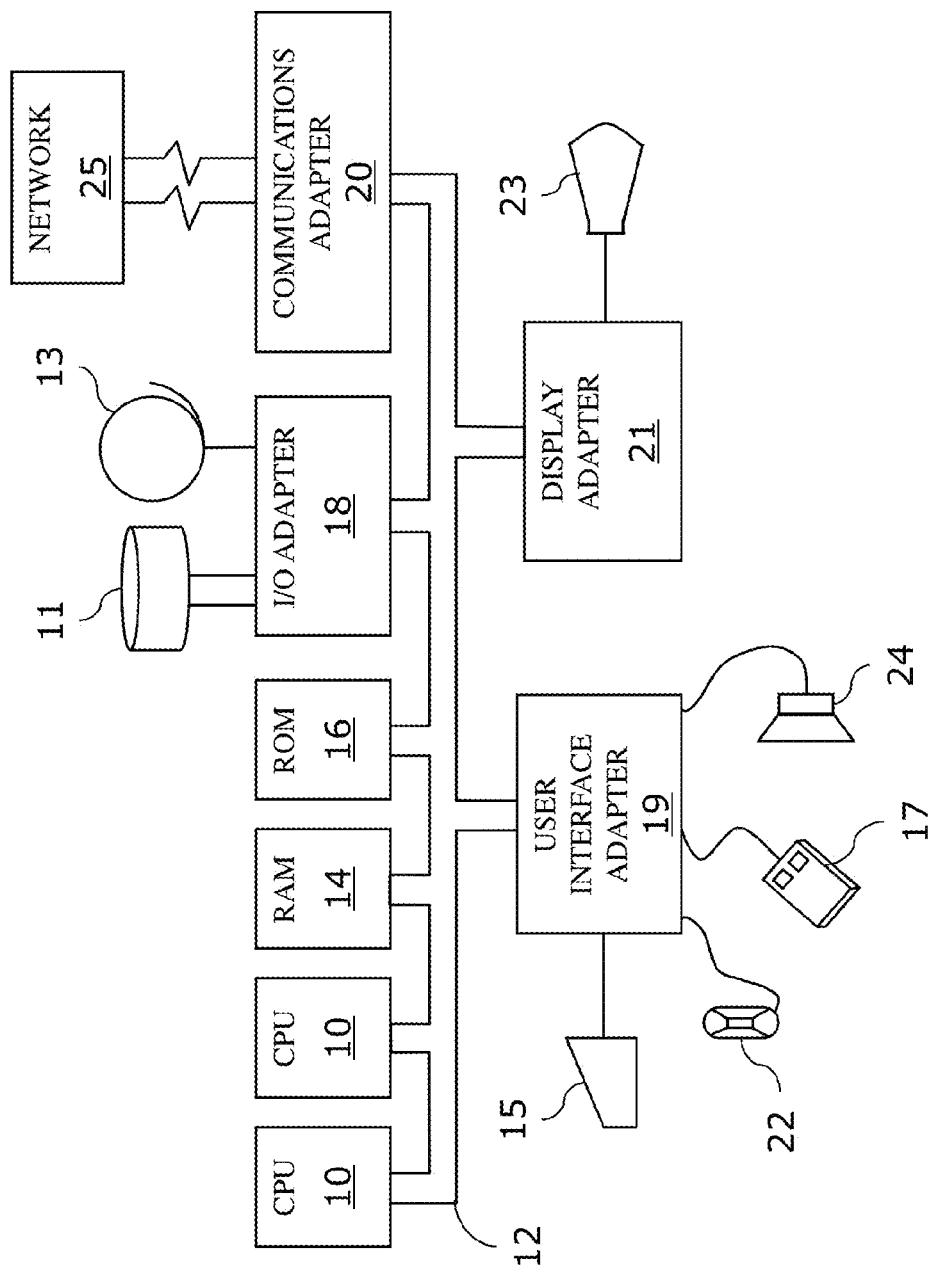
FIG. 4 is a schematic diagram illustrating an exemplary hardware system that can be used in the implementation of the design flow according to devices and methods herein.

A representative hardware environment for implementing the devices and methods herein is depicted in FIG. 4. This schematic drawing illustrates a hardware configuration of an information handling/computer system in accordance with the devices and methods herein. The system comprises at least one processor or central processing unit (CPU) 10. The CPUs 10 are interconnected via system bus 12 to various devices such as a Random Access Memory (RAM) 14, Read Only Memory (ROM) 16, and an Input/Output (I/O) adapter 18. The I/O adapter 18 can connect to peripheral devices, such as disk units 11 and tape drives 13, or other program storage devices that are readable by the system. The system can read the instructions on the program storage devices and follow these instructions to execute the methodology of the devices and methods herein.

In FIG. 4, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing or the like is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 including a network interface card such as a LAN card, a modem, or the like connects the bus 12 to a data processing network 25. The communication adapter 20 performs communication processing via a network such as the Internet. A display adapter 21 connects the bus 12 to a display device 23, which may be embodied as an output device such as a monitor (such as a Cathode Ray Tube (CRT), a Liquid Crystal Display (LCD), or the like), printer, or transmitter, for example.

The terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises," "comprising," and/or "including," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present disclosure have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A method, comprising:
   forming fins on a substrate;
   applying a first conformal liner layer on said fins;
   patterning said fins to define active portions of a semiconductor device in said fins using a first organic planarizing material;
   stripping said first organic planarizing material;
   patterning said fins in a direction perpendicular to fin to adjust the length of said fins using a second organic planarizing material;
   stripping said second organic planarizing material; and
   stripping said first conformal liner layer.

2. The method according to claim 1, said forming fins on said substrate further comprising:
   forming a hardmask on said substrate; and
   patterning said hardmask, said patterning said hardmask defining locations of said fins.

3. The method according to claim 2, said patterning further comprising:
   performing an etching process through said hardmask, said etching process forming a plurality of trenches in said substrate, said trenches defining said fins.

4. The method according to claim 1, further comprising:
   after said stripping said second organic planarizing material, applying a second conformal liner layer on said fins, said second conformal liner layer covering said first conformal liner layer on fin sidewalls and the fin tip in the orthogonal direction.

5. The method according to claim 1, said applying said first conformal liner layer on said fins further comprising:
   using a deposition method comprising atomic layer deposition or a variant of chemical vapor deposition.

6. The method according to claim 1, said patterning said fins to define active portions of said semiconductor device in said fins using said first organic planarizing material, further comprising:
   performing photolithography on said fins.

7. The method according to claim 1, said stripping said organic planarizing material, further comprising:
   performing wet stripping of said organic planarizing material using a mixture of sulfuric acid ($H_2SO_4$) and hydrogen peroxide ($H_2O_2$).

8. The method according to claim 1, said stripping said organic planarizing material, further comprising:

performing dry stripping of said organic planarizing material using plasma etch.

9. A method comprising:
forming a patterned hardmask layer on a semiconductor substrate;
performing an etching process through said patterned hardmask layer, said etching process forming a plurality of trenches in said semiconductor substrate, said trenches defining a fin;
depositing dielectric material on said hardmask layer;
planarizing said dielectric material, said planarizing stopping on said hardmask;
applying a first conformal liner layer on said fins;
patterning said fin to define active portions of a semiconductor device in said fin using a first organic planarizing material;
patterning said fin in a direction perpendicular to fin to adjust the length of said fin using a second organic planarizing material;
removing said hardmask layer; and
stripping said first conformal liner layer.

10. The method according to claim 9, further comprising:
applying a second conformal liner layer on said fin, said second conformal layer covering said the first conformal liner layer on fin sidewalls and the fin tip in the orthogonal direction.

11. The method according to claim 10, said first conformal liner layer and said second conformal liner layer comprising silicon oxide, silicon nitride, silicon oxynitride, or hafnium oxide.

12. The method according to claim 9, said applying said conformal liner layer on said fin further comprising:
using a deposition method comprising atomic layer deposition or a variant of chemical vapor deposition.

13. The method according to claim 9, patterning said fin to define active portions of said semiconductor device in said fins using said first organic planarizing material, further comprising:
performing photolithography on said fins.

14. The method according to claim 9, further comprising:
cleaning said organic planarizing material by performing wet stripping of said organic planarizing material using a mixture of sulfuric acid ($H_2SO_4$) and hydrogen peroxide ($H_2O_2$) or dry stripping of said organic planarizing material using plasma etch.

15. A computer program product for protecting channels during fin fabrication, said computer program product comprising a computer readable storage medium having program instructions embodied therewith, the program instructions being readable and executable by a computerized device to cause said computerized device to perform a method comprising:
forming fins on a substrate;
applying a first conformal liner layer on said fins;
patterning active portions of a semiconductor device in said fins using a first organic planarizing material;
cleaning said first organic planarizing material;
adjusting the length of said fins using a second organic planarizing material;
cleaning said second organic planarizing material; and
stripping said first conformal liner layer.

16. The computer program product according to claim 15, said method further comprising:
forming a hardmask on said substrate; and
patterning said hardmask, said patterning defining location of said fins.

17. The computer program product according to claim 16, said patterning further comprising:
performing an etching process through said hardmask, said etching process forming a plurality of trenches in said substrate, said trenches defining said fins.

18. The computer program product according to claim 15, said method further comprising:
after said cleaning said second organic planarizing material, applying an additional conformal liner layer on said fins, said additional conformal liner layer covering said first liner on fin sidewalls and the fin tip in the orthogonal direction.

19. The computer program product according to claim 15, said applying said first conformal liner layer on said fins further comprising:
using a deposition method comprising atomic layer deposition or a variant of chemical vapor deposition.

20. The computer program product according to claim 15, said cleaning said organic planarizing material, further comprising:
performing wet stripping of said organic planarizing material using a mixture of sulfuric acid ($H_2SO_4$) and hydrogen peroxide ($H_2O_2$) or dry stripping of said organic planarizing material using plasma etch.

* * * * *

UNITED STATES PATENT AND TRADEMARK OFFICE
CERTIFICATE OF CORRECTION

PATENT NO.        : 9,496,371 B1
APPLICATION NO.   : 14/877051
DATED             : November 15, 2016
INVENTOR(S)       : Arndt et al.

Page 1 of 1

It is certified that error appears in the above-identified patent and that said Letters Patent is hereby corrected as shown below:

On the Title Page

Item (74) Attorney, Agent, or Firm

Please correct the registered Patent attorney's name on Line 2 to: Steven J. Meyers Signed and Sealed this
Eighteenth Day of April, 2017

Michelle K. Lee
*Director of the United States Patent and Trademark Office*